United States Patent
Brown et al.

[11] Patent Number: 5,959,461
[45] Date of Patent: Sep. 28, 1999

[54] PROBE STATION ADAPTER FOR BACKSIDE EMISSION INSPECTION

[75] Inventors: John Brown, Brookfield; Matthew J. Costello, Bethel; Luciano P. DosSantos, Danbury; Robin Ruck, Southbury, all of Conn.

[73] Assignee: Wentworth Laboratories, Inc., Brookfield, Conn.

[21] Appl. No.: 08/892,290

[22] Filed: Jul. 14, 1997

[51] Int. Cl.⁶ .......................... G01R 31/26; G01R 31/308
[52] U.S. Cl. .......................... 324/765; 324/753; 324/754
[58] Field of Search .................................. 324/750–753, 324/754–758, 765

[56] References Cited

U.S. PATENT DOCUMENTS

| | | | |
|---|---|---|---|
| 4,575,676 | 3/1986 | Palkuti | 324/750 |
| 4,706,019 | 11/1987 | Richardson | 324/751 |
| 4,755,874 | 7/1988 | Esrig et al. | 348/126 |
| 5,136,373 | 8/1992 | Kamiya et al. | 348/92 |
| 5,493,236 | 2/1996 | Ishii et al. | 324/752 |
| 5,661,408 | 8/1997 | Kamieniecki et al. | 324/765 |

OTHER PUBLICATIONS

Hypervision BEAMS product brochure (4 pages) (Date unavailable).

Primary Examiner—Josie Ballato
Assistant Examiner—Russell M. Kobert
Attorney, Agent, or Firm—William C. Crutcher

[57] ABSTRACT

An adapter for holding a silicon wafer in an inverted position of a probe station to allow backside emission testing is described. The wafer is positioned in a carrier having an opening therethrough for backside emission testing while the wafer is energized and probed beneath the carrier. A special probe card holder is provided with a self-leveling feature by means of a leveling frame on the probe card holder cooperating with the wafer carrier.

11 Claims, 8 Drawing Sheets

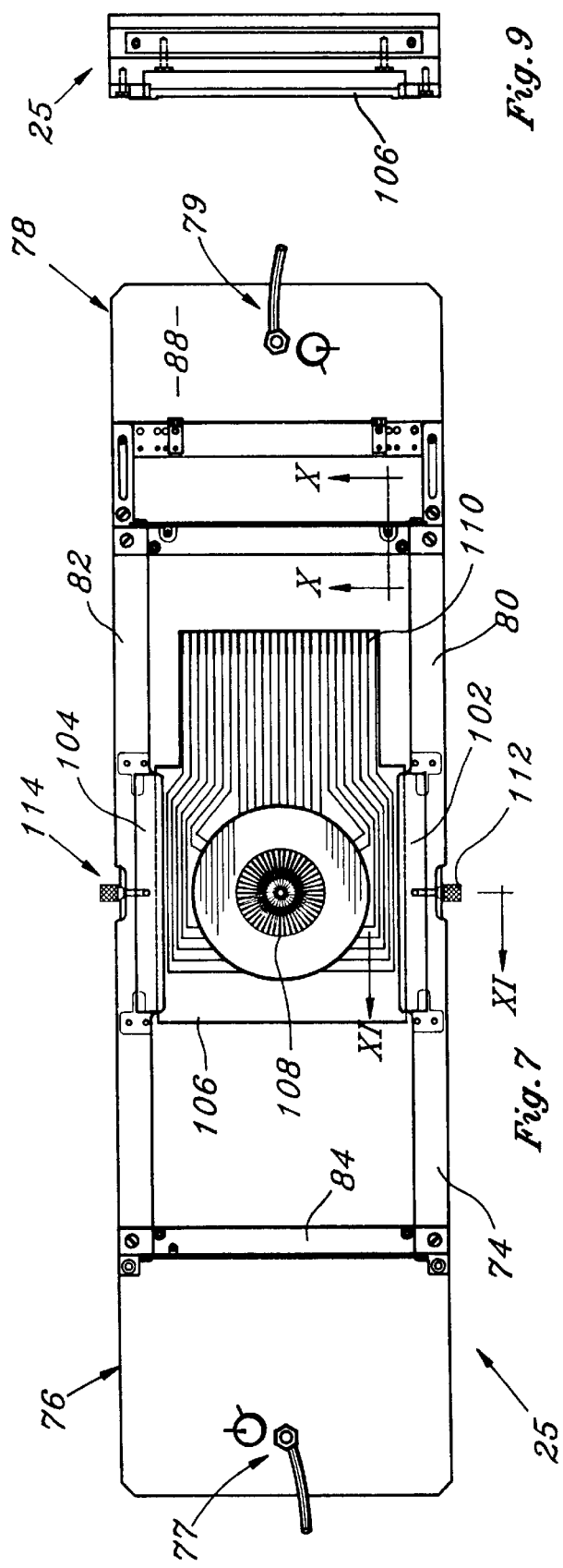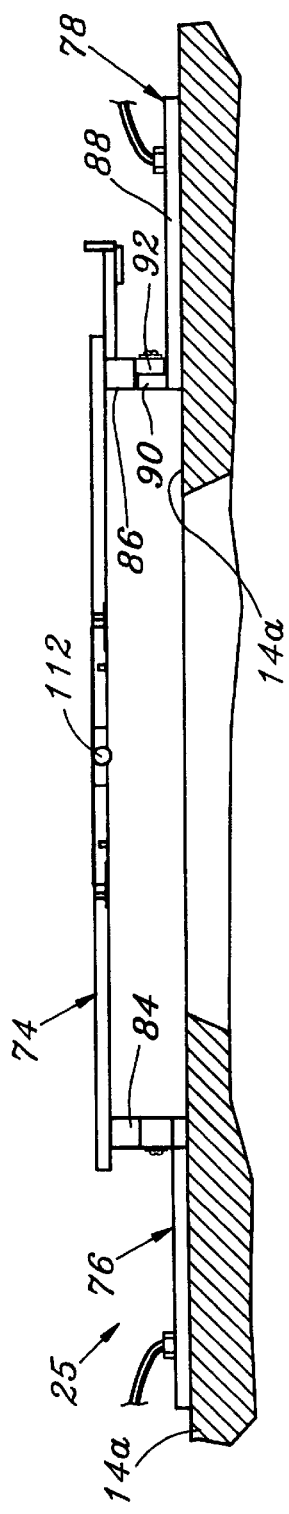

PROBE STATION ADAPTER FOR BACKSIDE EMISSION INSPECTION

BACKGROUND OF THE INVENTION

This invention relates generally to inspection of integrated circuit devices on a silicon wafer in a probe station, and more particularly to an adapter and probe card holder for energizing and probing a silicon wafer in an inverted position for analysis of backside emissions.

Probe stations are well known as a means for wafer probing and failure analysis investigations of a device under test (DUT) on a silicon wafer. A probe station generally involves a platform for mounting probing apparatus such as a probe card or probe holders, a moveable chuck for holding the wafer with x, y, z and theta stages for positioning the chuck, and an optic system with video imaging and integrated system software to monitor the progress of the probing and failure analysis on a computer screen. Normally, probing of the device is done from above on the top side of the wafer which faces upwardly, while its opposite (or backside) faces downwardly.

One type of analysis involves energizing the DUT in order to observe infrared emissions from a defect, consisting of overlaying an illuminated device image showing device details with another image of infrared emissions from the energized device. The images are superimposed to determine the location of the defect. Difficulties are encountered with this type of analysis after several layers have been added to the silicon substrate. This problem has led to a similar analysis known as backside emission inspection. Under this procedure, the silicon wafer is inspected from the backside of the wafer, usually in an inverted position. The back of the wafer is first treated to reduce its thickness at the location to be inspected and the backside is illuminated at special frequencies and using special sensors to observe emissions from the backside of the energized device. The precise equipment necessary to illuminate and detect backside emissions is not the subject of the present invention.

The present invention involves the use of a conventional probe station in order to adapt it for backside emission inspection, and probing from the underside of a silicon wafer held in an inverted position, together with various features necessary for backside emission inspection.

Existing apparatus for backside emission testing has required unacceptably long set-up times to adapt and calibrate the probe station to enable probing from the underside of the silicon wafer and to energize the DUT. The probed surface must be planar with respect to the plane of motion of the probing apparatus, (or with respect to the probe card). It would be desirable to have an adapter which is readily and quickly set up for backside emission inspection, and which also can be utilized in a standard probe station, rather than requiring a special probe station.

Accordingly, one object of the present invention is to provide an improved apparatus for inspecting an inverted silicon wafer for backside emissions in a probe station.

Another object of the invention is to provide an improved adapter for holding a silicon wafer in an inverted position in a standard probe station for backside emission testing, together with probing means to energize the wafer from the underside thereof.

Another object of the invention is to provide an adapter for backside emission testing of a silicon wafer with means to establish planarity of the inverted silicon wafer surface with respect to a probe card, by self-leveling of the probe card holder.

SUMMARY OF THE INVENTON

Briefly stated, the invention comprises apparatus for inspecting an inverted silicon wafer having devices thereon for backside emissions using an emission imaging system and a probe station of the type having a platform defining a first reference surface, a movable stage having a chuck support with control means to change its position with respect to the platform, and emission imaging devices disposed above the platform. The apparatus of the invention comprises a backside emission adapter including a frame arranged to be supported on the chuck (or chuck support), a leveling ring supported in the frame by first adjustment means, and a wafer carrier disposed in said leveling ring. The wafer carrier has a downwardly facing, second reference surface and is adapted to hold a silicon wafer against the second reference surface in an inverted position. The wafer carrier has at least one opening exposing the backside of the wafer to the emission imaging devices. Probe means are held on the platform reference surface, and adapted to probe and energize at least one of said devices from beneath the silicon wafer. A video camera is also supported on the platform reference surface, having a viewing tube extending to a point beneath the silicon wafer to a location proximal to said energized device, the viewing tube having means to illuminate the energized device and optics for directing reflected illumination to the video camera.

Preferably the probe means comprises a probe card holder, including a base structure arranged to be supported on the platform reference surface, a leveling frame supported on the base structure, the leveling frame having an upwardly facing third reference surface and having second adjustment means for adjusting the position of the third reference surface of the leveling frame with respect to the base structure, and a clamping mechanism for holding a probe card in a planar relationship with respect to the third reference surface.

Various other features include a safety ring for the silicon wafer, clamps for holding the wafer carrier in the leveling ring, three-screw spring loaded support for the first adjustment means, a spring loaded clamp for the second adjustment means, and a simplified clamping mechanism for holding the probe card.

DRAWINGS

These and many other objects of the invention will become apparent by reference to the following description, taken in connection with the accompanying drawings, in which:

FIG. 1 is a front elevation view of a standard probe station equipped with conventional DUT viewing optics together with a probe card holder and adapter according to the present invention, FIG. 2 is a top plan view of the probe station of FIG. 1, FIG. 3 is a side elevation view of the probe station of FIG. 1, showing a part of backside emission optics, FIG. 4 is a front elevation view of the same probe station, illustrating the adapter with a single probe manipulator instead of a probe card holder and also illustrating the video camera apparatus, FIG. 5 is an exploded perspective view of the adapter and wafer carrier illustrating the wafer in inverted position, rotated 90° from FIG. 1, FIG. 6 is a top plan view of the wafer carrier before it is inverted and placed in the leveling ring, FIG. 7 is a top plan view of a probe card holder according to the present invention, showing a probe card in place, FIG. 8 is a side elevational view of the probe card holder of FIG. 7, without probe card, FIG. 9 is an end elevational view of the probe card holder of FIG. 7, without probe card, FIG. 10 is a view in cross section of the spring loaded, self-leveling adjustment of the probe card holder, taken along lines X—X of FIG. 7, FIG. 11 is an elevation view in cross section taken along lines XI—XI of FIG. 7, FIG. 12 is a top plan view of the video camera illuminating and optics configuration on the end of the camera viewing tube seen in FIG. 4, FIG. 13 is a side elevational view of the FIG. 12 illuminator and optics illustrating the method of operation, and FIG. 14 is a simplified diagrammatic view illustrating the self-leveling method of establishing planarity of the probe card holder with respect to the wafer carrier.

DESCRIPTION OF THE PREFERRED EMBODIMENT

Figure 1:
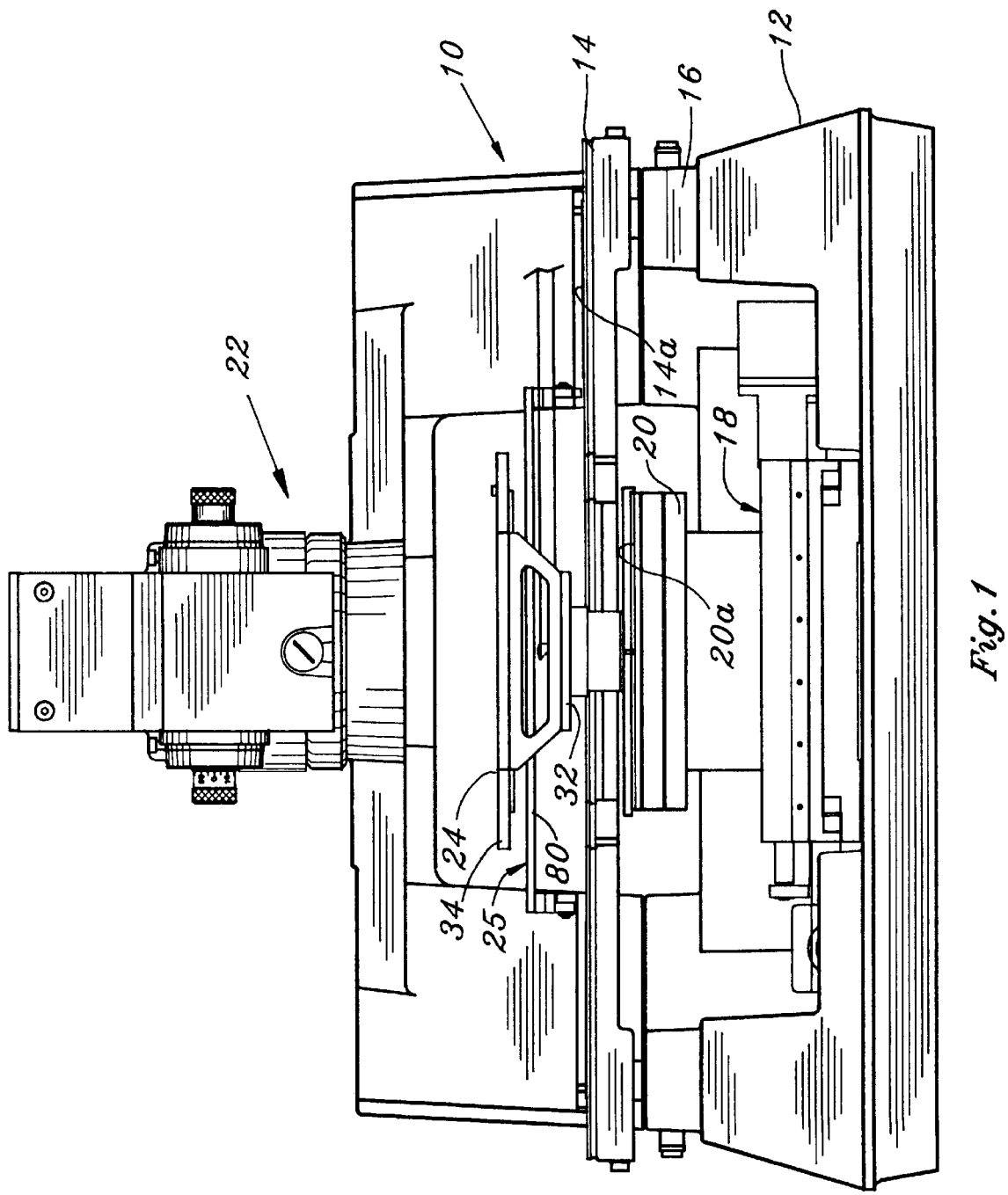
Figure 2:
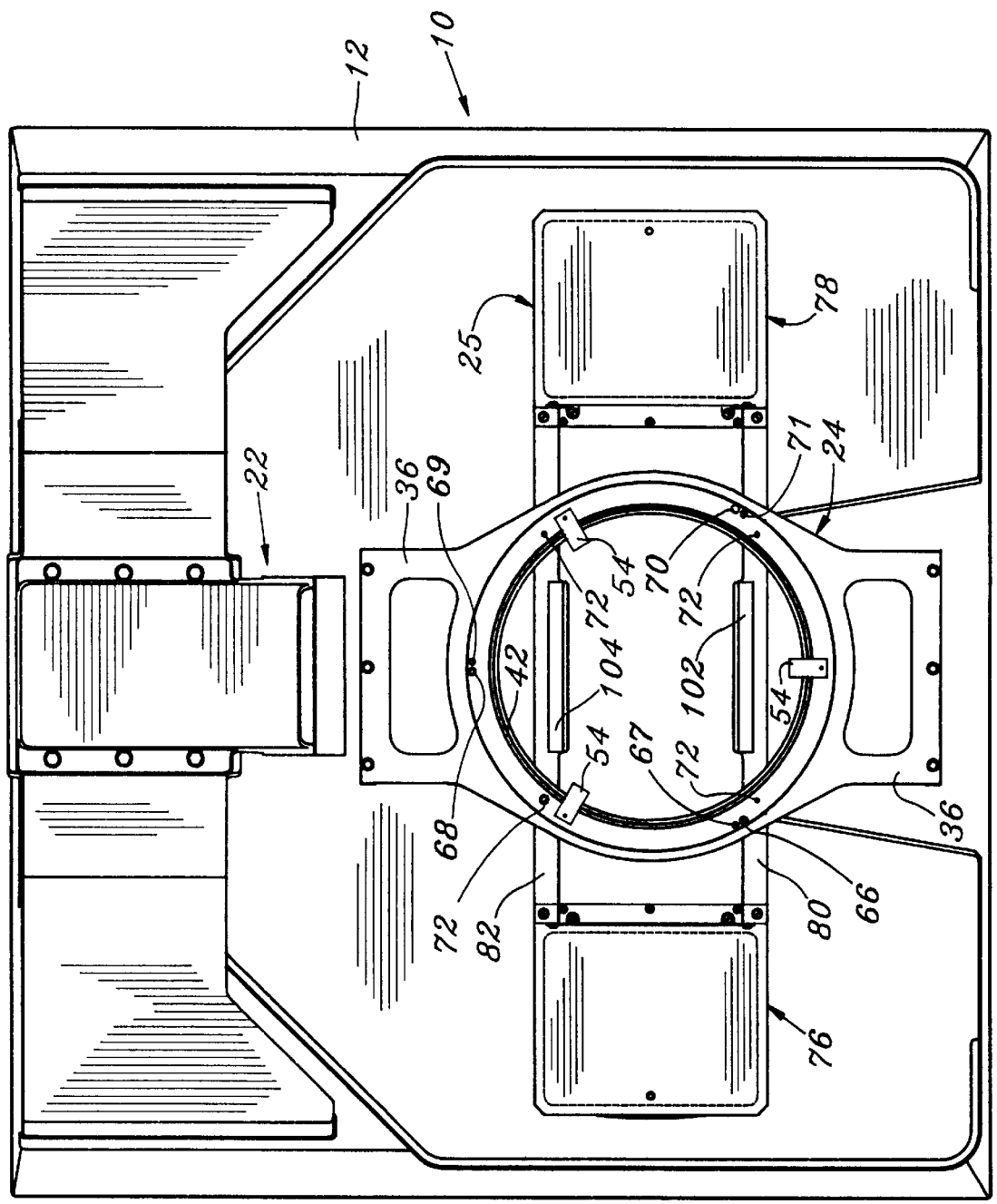
Figure 3:
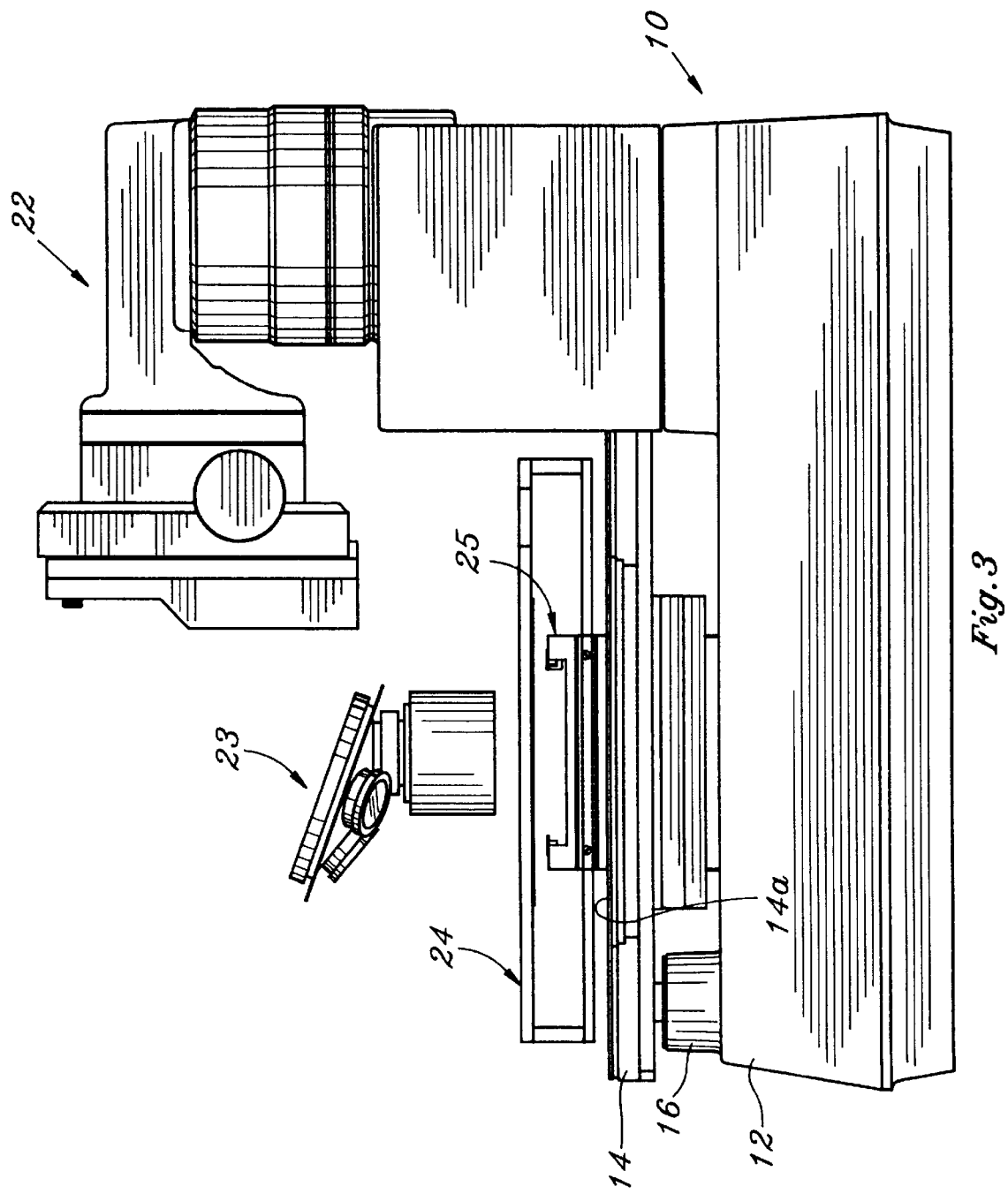

Referring now to FIG. 1 of the drawing, a standard probe station is illustrated in front elevation view, with accompanying plan view in FIG. 2 and side elevational view in FIG. 3. The probe station is illustrated generally at 10 and may, for example, comprise a model MP-2000 semi-automatic analytical probe station designed for semi-automatic wafer probing and failure analysis applications involving sub-micron geometries as manufactured and sold by Wentworth Laboratories, the assignee of the present invention. A manual probe station may also be used. The probe station comprises a stationary base 12 supporting a platform 14 on pedestals, one of which is seen at 16. Platform 14 is arranged to provide a motorized vertical (z) travel of 1½ inches. An x-y positioning stage 18 serves to mount a chuck support 20 and to provide an additional minimum z travel of 0.2 inches. Chuck support 20 is positionable in the x-y direction with a resolution of 0.1 microns. The platform 14 is provided with a top planar first reference surface 14a and the top of the chuck support 20 is provided with a support surface 20a factory calibrated to maintain planarity during x-y movement in planes parallel to the first reference surface 14a.

The probe station is equipped with conventional DUT viewing optics 22, a vacuum holding system, vibration isolation and requires a computer to control stage movement and to operate live on-screen video of the probing operation.

EMISSION IMAGING SYSTEM

While the details of the emission imaging system are not material to the present invention, a brief description follows of the emission imaging system, a partial view of which is shown generally by reference numeral 23 in FIG. 3, to be disposed above the platform. The emission imaging devices include an illuminating system at a wave length of approximately 1070 nanometers at which silicon is semi-transparent. This system produces an illuminated image of the backside semi-conductor metalization on the wafer. In addition, the emission imaging devices include one or more IR sensors designed to detect "hot spots" when the DUT is energized by suitable probes and associated electronics. The emission image showing the defect is superimposed with the illuminated (reflected) image. Suitable equipment for backside illumination and emission inspection is commercially available from Hypervision, Inc. and other manufacturers.

BACKSIDE EMISSION ADAPTER

In accordance with the present invention, probe station 10 is equipped with a backside emission adapter shown generally at 24, arranged to be supported on the reference surface 20a of chuck support 20. The adapter could also be supported directly on the chuck or could be incorporated into and/or fixedly attached to the chuck support. The backside emission adapter (referred to hereinafter as BEA or "adapter") serves to support the wafer carrier and wafer in an inverted position, following the movements of chuck support 20. The term "inverted position" is opposed to the conventional probing arrangement wherein the silicon wafer is held on top of a wafer carrier with the probes above the DUT. Reference to the exploded perspective view of FIG. 5 and FIG. 6, the BEA 24 will be explained in detail.

Figure 5:
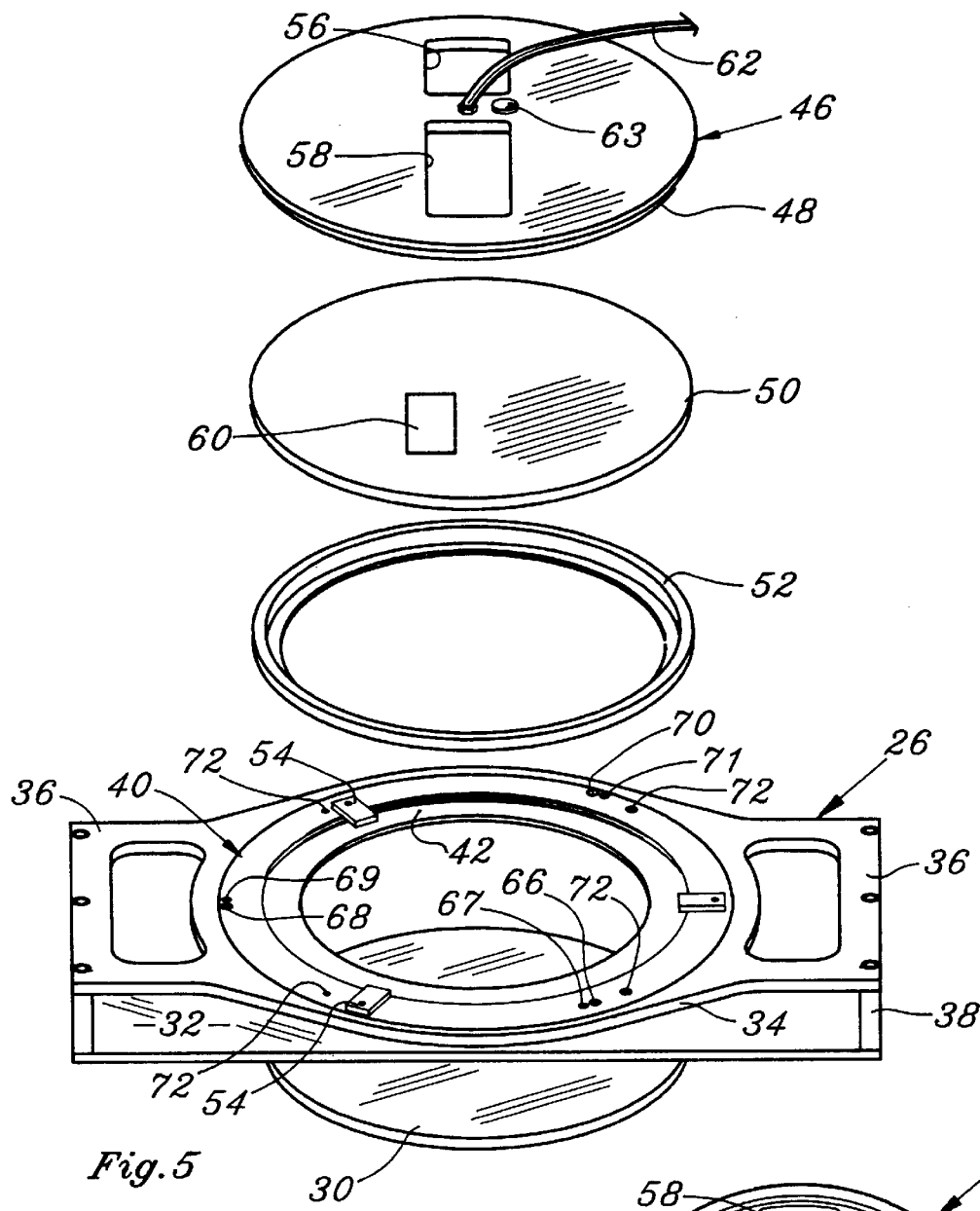

Referring to FIG. 5, BEA 24 includes a frame shown generally at 26 having a circular base 30 adapted to fit on the chuck support 20, a pedestal 31 (see FIG. 14) supporting a bridge member 32 and a ring support 34, with extending portions 36. Ring support 34 is held spaced from bridge 32 by means of legs 38 beneath the extensions 36.

Disposed within the opening of ring support 34 is a leveling ring 40 which, in turn, has a depending circumferential lip 42. Support lip 42 serves to support a wafer carrier shown generally at 46. The underside of wafer carrier 46 (see FIG. 6) defines a downwardly facing, circular surface 48 (second reference surface) for supporting a silicon wafer 50 of the same diameter. A safety ring 52 slips over the circumferential edge of wafer 50 and edge of wafer carrier 46 so that both fit within the leveling ring 40. Leveling ring 40 further includes rotatable bars 54, which lock the wafer carrier 46 in the ring 40.

In accordance with one aspect of the present invention, the wafer carrier 46 defines carefully positioned openings 56, 58 which are arranged so that the backside of any device on wafer 50 may be exposed through one of the openings 56, 58 by rotatably positioning the wafer. Wafer 50 may be prepared by thinning at the location of the DUT with a milling machine as shown by area 60. The thinned wafer is extremely fragile at this location and is fully supported by wafer carrier 46 around the openings 56, 58. A vacuum hose 62 is connected to wafer carrier 46 to retain the wafer to the surface 48, and may be conveniently turned off and on at this point by a control knob 63.

While the wafer carrier 46 with openings 56, 58 is a preferred carrier because of the full support of the fragile wafer, it is possible to use an adapter as described with a wafer carrier which is completely open and only supports the wafer at the circumferential edge. This is less desirable because it is more likely to result in inadvertent and irretrievable damage of an expensive wafer.

Figure 6:
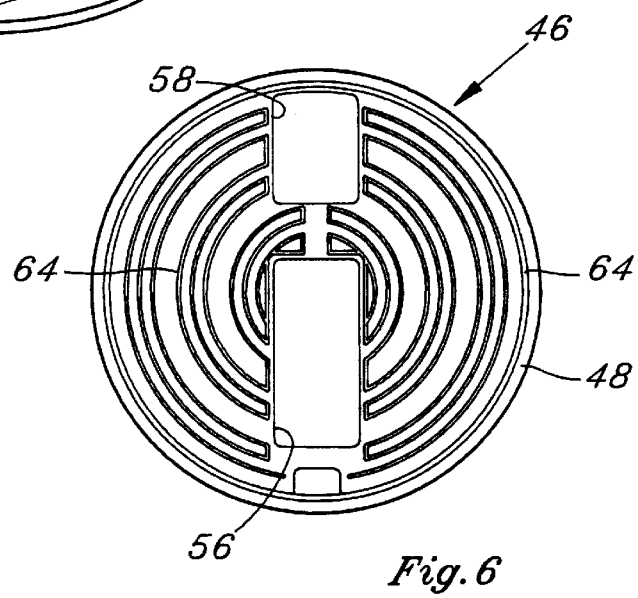

Referring to FIG. 6 of the drawing, the underside or working surface 48 of carrier 46 is shown to include conventional grooves 64 providing uniform vacuum passages to securely hold the silicon wafer to surface 48.

Referring again to FIG. 5, the leveling ring includes means to adjust the position of wafer carrier 46, specifically its surface 48, with respect to the chuck support plane of motion. Three adjustment screws 66, 68, 70 with adjacent locking set screws 67, 69, 71 are provided to adjust the plane of the leveling ring and with it the wafer carrier 46 and wafer support surface 48 in a known manner by adjusting the screws until an indicator probe mounted on the platform 14 indicates that surface 48 is moving in a plane parallel to the platform reference plane.

Lastly, the leveling ring also includes four internally threaded holes, one of which is indicated at 72. Holes 72 are located at the vertices of a rectangle for a purpose to be explained in conjunction with the probe card holder.

PROBE CARD HOLDER

As seen in FIGS. 1–3, the backside emission adapter (BEA) 24 may be used in conjunction with a probe card holder (PCH) 25. PCH 25 will now be described in detail by reference to FIGS. 7–11 of the drawing. PCH 25 comprises three parts, a leveling frame 74 and a pair of platform bases 76, 78, which support the leveling frame. Leveling frame 74, in turn, includes a pair of side rails 80, 82 attached to cross members 84, 86. Base 70 includes a flat plate 88 with its underside adapted for vacuum attachment to the platform surface 14a, using hose connection and control knob shown at 79. Base 76 is similarly adapted for vacuum attachment with hose fitting and control knob 77. Other equivalent means of attachment to platform surface 14a include magnetic means or attachments.

The details of the spring loaded support and adjustment are discussed in connection with base 78. An upright cross piece 90 is attached by screws to plate 88, and a spring loaded support cross piece 92 attached to cross piece 90 supports the cross member 86 of the leveling frame. Base 78 is similarly constructed.

Figure 10:
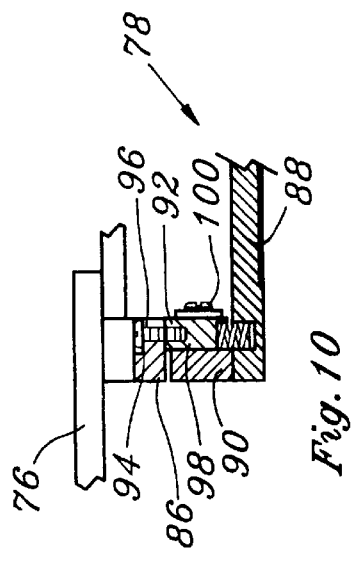

In order to see the details of the spring loaded adjustment and support for one end of the leveling frame, see FIG. 10 which is a cross section taken along lines X—X of FIG. 7. As shown in FIG. 10, a screw 94 extends through an open ended slot 96 in the end of cross member 86, and through a hole in cross member 92. Member 92 is sidably mounted by screw 100 against a compression spring 98. Member 92 may be clamped against member 90 by means of a screw 100. This arrangement allows for removal of the leveling frame 74 from platform base 78 by loosening screw 94 and utilizing slot 96. Secondly, the member 92 is vertically adjustable with respect to plate 88 by means of spring 98 and the clamping screw 100 when the proper position is achieved.

The tops of rails 80, 82 are provided with raised leveling surfaces 102, 104 with carefully machined upper surfaces (or third reference surfaces) to be used in conjunction with the self-leveling feature for calibration and adjustment of planarity of the probe card holder 25. A typical probe card 106 is shown with opposite edges positioned along and beneath the edges of surfaces 102, 104. As is well known in the art, probe card 106 includes probing needles 108 electrically connected to corresponding leads 110 on the probe card surface. Although normal probing is done with the tips of the needles pointed downwardly toward the DUT, in the case of backside emission inspection, the probing needles are directed upwardly toward the device on the inverted silicon wafer.

Figure 11:
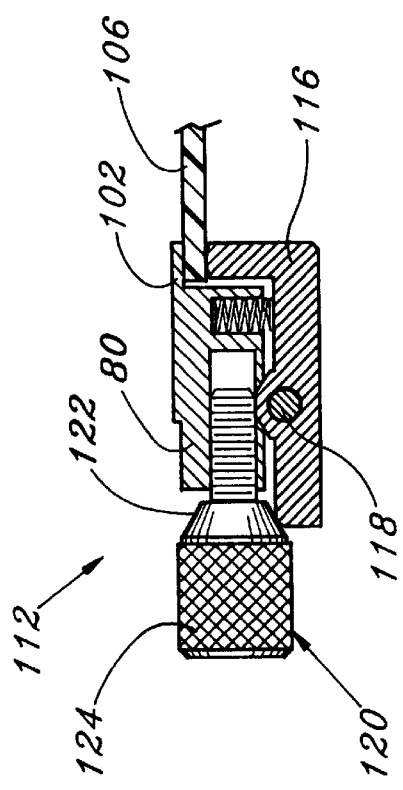

Probe card 106 is held by special clamping devices 112, 114 mounted on the respective rails 80, 82. Reference to the detail view of FIG. 11 illustrates the construction of clamp 112. An angled clamping member 116 is pivotably mounted on a pin 118. A threaded member 120 with a conical section 122 may be screwed into the rail 80 by manually rotating the knob 124. The conical section acts as a wedge and causes clamp 116 to pivot about pin 118, so as to clamp the probe card 106 against the lower side of the leveling surface plate 102. In this manner, the upper surface of probe card 106 is substantially parallel to the upper surface of plate 102.

BACKSIDE EMISSION INSPECTION USING A MANIPULATOR PROBE

Figure 4:
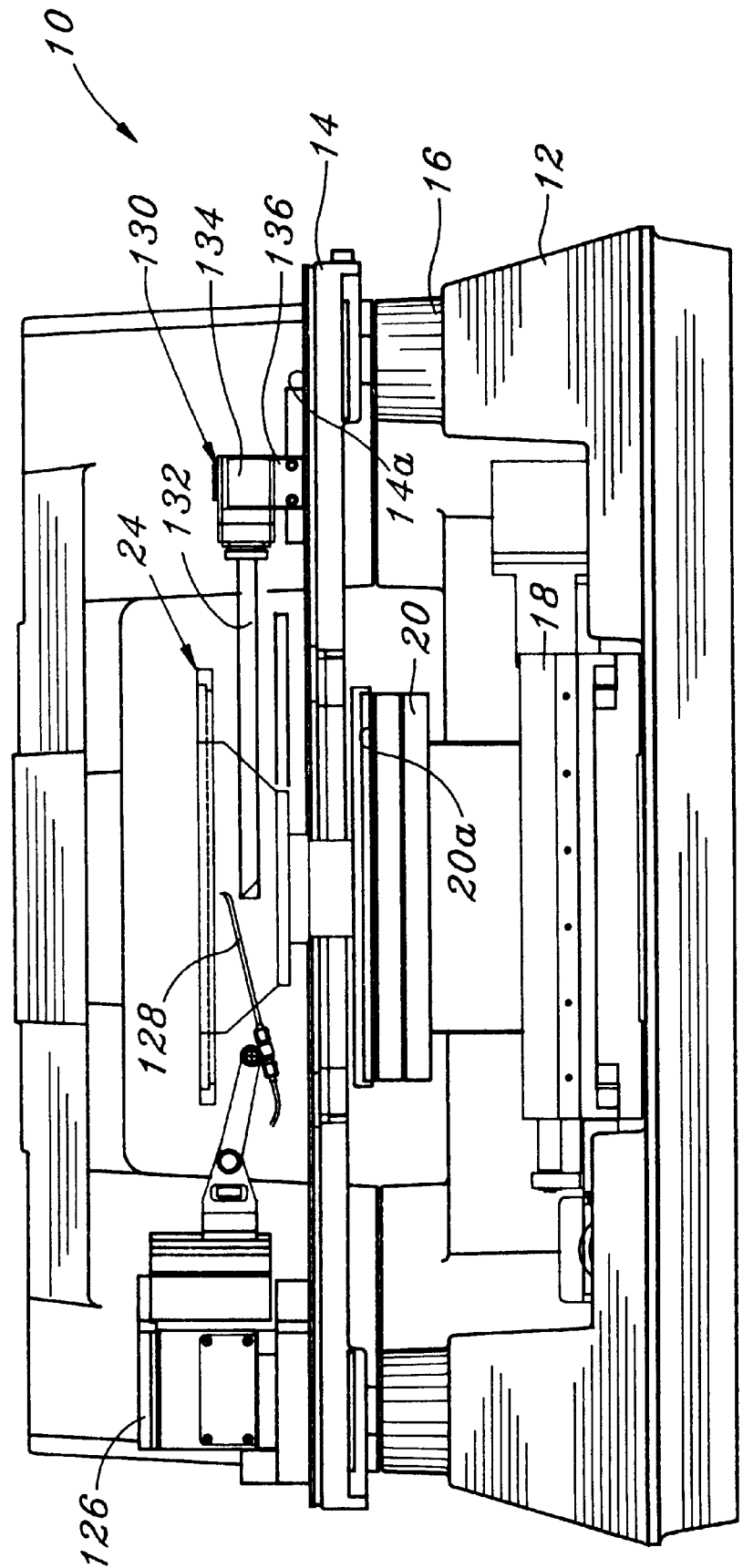

Although the invention is especially useful when used in conjunction with the probe card holder 25, reference to FIG. 4 of the drawing shows the probe station 10 as previously described but omitting the details of the DUT viewing optics 22 and the backside emission imaging device 23, it being understood that these will be the same as in FIGS. 1–3. The identical elements of probe station 10 shown in FIGS. 1–3 are indicated by the same reference numerals in FIG. 4. Also the BEA 24 is illustrated and constructed in the same manner as previously described above.

Instead of the probe card holder 25, shown in FIG. 1, a conventional probe manipulator 126 is shown incorporating a probe holder 128 positioned to probe upwardly against the inverted silicon wafer held in the BEA wafer carrier previously described. Several such manipulators 126 may be employed in order to probe and energize the wafer for backside emission inspection. A suitable manipulator is the HOP 2000 manipulator manufactured by Wentworth Laboratories. Also illustrated in FIG. 4 is a video camera 130 with extension viewing tube 132. Viewing tube 132 is equipped at its terminating end with illumination, prism and optics in a manner which will be described in detail later but not shown in FIG. 4. Also, the same video camera 130 and extension viewing tube 132 will be employed in the system shown in FIGS. 1–3, but is not shown in those figures in order to avoid complicating the drawing. However, it will be understood that camera 130 and viewing tube 132 are normally employed as an integral part of the backside emission inspection system.

VIDEO CAMERA SYSTEM

The camera system includes a conventional video camera 130 with viewing tube 132 disposed on a mounting 134 permitting its rotation about an axis. Mounting 134 is supported on a base plate 136, which is adapted for vacuum attachment to platform surface 14a, and having a vacuum control knob as before.

Figure 12:
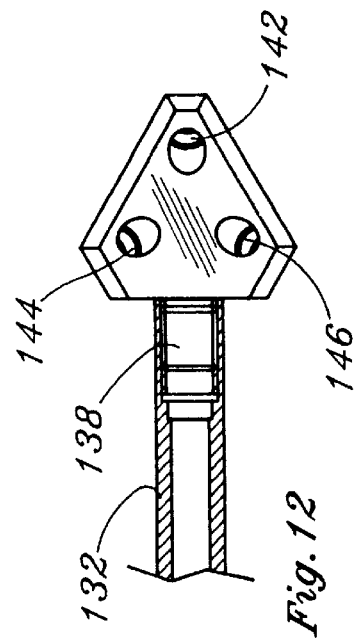
Figure 13:
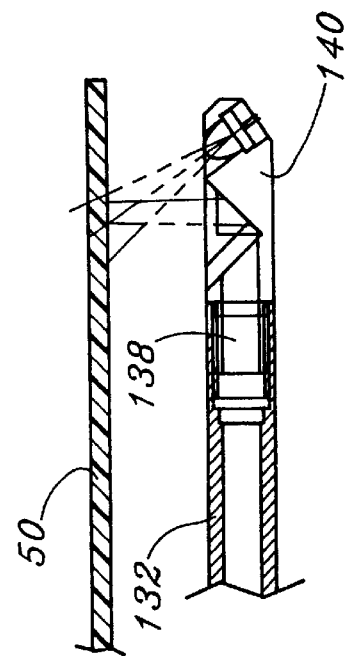

Details of the terminating end of viewing tube 132 are seen in plan view of FIG. 12 and elevation view of FIG. 13. An optical element (lens) 138 and prism 140 direct a viewed image on the underside of wafer 50 toward video camera 130. The wafer inspection point is illuminated by angled LED's 142, 144, 146 disposed about the prism exit point and directed toward the wafer. The image thus illuminated and viewed is rotated and adjusted by the appropriate software in the computer to compensate for the fact that probing is taking place in the reverse direction from that conventionally done.

CALIBRATION OF PLANARITY OF PROBE CARD HOLDER

As shown in FIGS. 1, 2 and 3, the probe card holder 25 is used in conjunction with the backside emission adapter 24. The backside emission adapter 24 supports the wafer carrier 46 (FIG. 5) from the chuck support surface as best seen in FIG. 1. The side rails 80, 82 of the leveling frame of PCH 25 pass through the space between bridge 32 and ring support 34 of BEA 24.

Figure 14:
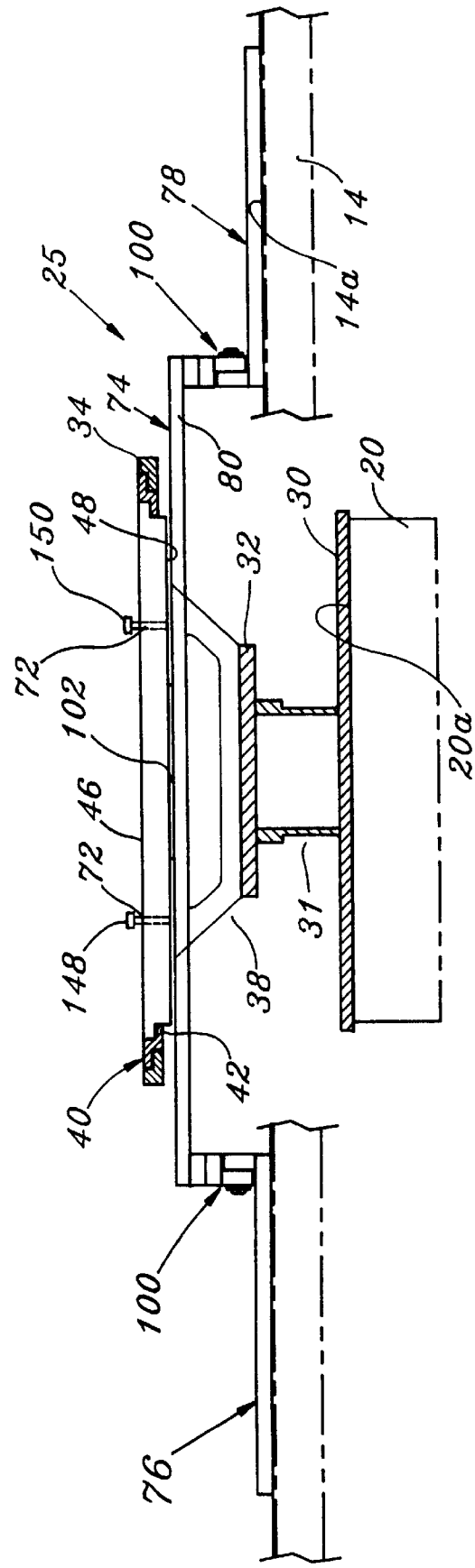

A clearer view of the calibrating operation is illustrated in the simplified cross sectional view of FIG. 14. There, the platform 14 with reference surface 14a and the chuck support 20 with support surface 20a are shown in phantom lines. BEA 24 rests on the chuck and carrier ring 46 (without the silicon wafer or safety ring) is shown after it has been leveled with the first adjustment means of the leveling ring. The adjustment places the second reference surface 48 on the wafer carrier to move in a plane parallel with the plane of the platform reference surface.

The probe card holder 25 comprises the mounting base member 76, 78 vacuum clamped to the reference surface 14a of platform 14 and supporting the leveling frame 74. The clamping screws 100 are loosened so that frame 74 is movable with respect to mounting plate 76, 78 on the biasing springs. Chuck support 20 is lowered until the upwardly facing leveling surfaces 102, 104 (third reference surface) contact the downwardly facing wafer carrier reference surface 48 (second reference surface). Then screws 100 are tightened to clamp the leveling frame 74. In this manner, the plane containing leveling surfaces 102, 104 is co-planar with the silicon support surface 48. This is the self-leveling feature of the invention and is easily and quickly accomplished.

OPERATION

Calibration in the aforesaid manner of the probe card holder with the backside emission adapter takes place as described above. Next, the clamps 54 are rotated to allow removal of the wafer carrier ring 46, which is turned over as shown in FIG. 6, the wafer 50 and safety ring 52 applied, vacuum is applied and then the carrier is turned back over and placed in the leveling ring and clamped in place. The wafer is located so that the DUT is below one of the windows 56, 58 in the carrier, while the rest of the wafer is supported around the windows. The DUT is energized and probed, either using the probe card 106 in probe card holder 25 or probe manipulators 126 as desired. Backside emission inspections are carried out, while probing is monitored and controlled by chuck movements with the assistance of the video camera imaging system previously described.

FINE ADJUSTMENT DUE TO IRREGULAR PROBE CARD

As mentioned in connection with FIG. 2, threaded holes 72 are provided laid out in a rectangular pattern. These correspond to the spacing of rails 80, 82. In the case of irregular probe cards, further fine adjustment is possible by employing holes 72, together with leveling screws two of which are seen at 148, 150. These are employed after a probe card is in place and a silicon wafer is supported in the wafer carrier 46. Screws 100 clamping the leveling frame may be loosened, and screws 148, 150 manipulated while observing imaging during actual probing to fine tune the planarity of the actual probe needle points with the silicon rather than depending upon planarity of the probe card and silicon supporting surfaces. Then screws 100 are re-tightened and probing commenced for backside emission inspection.

While there has been described what is considered to be the preferred embodiment of the invention, other modifications will occur to those skilled in the art. It is desired to secure in the appended claims all such modifications as fall within the true spirit and scope of the invention.

We claim:

1. Apparatus for inspecting an inverted silicon wafer for backside emissions in an emission imaging probe station of the type having a platform defining a first reference surface, a movable stage having a chuck support with control means to change its position with respect to the platform, and emission imaging devices disposed above the platform, said silica wafer having devices thereon and having a front side whereon said devices may be probed and a back side opposite the front side, the apparatus comprising:

a backside emission adapter including a frame arranged to be supported on the chuck support, a leveling member supported in said frame by first adjustment means, and a wafer carrier disposed in said leveling member, said wafer carrier having a second reference surface and adapted to hold a silicon wafer in an inverted position with the front side facing downwardly and back side facing upwardly, said wafer carrier defining at least one opening exposing the backside of the wafer to said emission imaging devices, probe means disposed on said platform first reference surface, and adapted to probe and energize at least one of said devices from beneath on the front side of the silicon wafer, and a video camera having a viewing tube extending therefrom to a point beneath the silicon wafer to a location proximal to said energized device on the front side of the silicon wafer, the viewing tube having means to illuminate the energized device and optics for directing reflected illumination to the video camera.

2. Apparatus according to claim 1, wherein the probe means comprises a probe card holder, including a base structure arranged to be supported on the platform first reference surface, a leveling frame supported on the base structure, said leveling frame having a third reference surface and having second adjustment means for adjusting the position of the third reference surface of the leveling frame with respect to the base structure, and a clamping mechanism for holding a probe card in a planar relationship with respect to the third reference surface.

3. Apparatus according to claim 2, including fine adjustment means for adjusting the third reference surface with respect to the second reference surface, so as to compensate for probe card irregularities.

4. The apparatus according to claim 2, wherein the probe card holder base structure comprises a pair of platform bases each adapted for vacuum attachment to the probe-station platform reference surface, each of said pair of platform bases arranged to hold the leveling frame in an adjustable spring biased mounting.

5. The apparatus according to claim 2, wherein the leveling frame includes a pair of side rails spaced to receive a probe card, the side rails having means defining said third reference surface thereon.

6. The apparatus according to claim 2, wherein said clamping mechanism includes a manually actuatable clamp on a said side rail for clamping an edge of a probe card to the side rail adjacent the third reference surface.

7. Apparatus according to claim 1, including means for locking the leveling frame with respect to the base structure when the second and third reference surfaces are in contact, so as to provide self-leveling of the probe card holder with respect to the wafer carrier.

8. Apparatus according to claim 1, wherein the probe means comprises at least one probe manipulator and having a probe and probe holder arranged to probe the underside of said inverted silicon wafer.

9. The apparatus according to claim 1, wherein said first leveling member is a leveling ring adapted to receive the wafer carrier and wherein the first adjustment means comprises three circumferentially spaced screws adapted to adjust the position of the leveling ring in said adapter frame.

10. The apparatus according to claim 1, including a safety ring having a circumferential lip adapted to extend over the outer edge of a silicon wafer and adapted to fit over the wafer carrier, so as to retain the wafer on the carrier.

11. The apparatus according to claim 1, wherein said opening is located and dimensioned so as to permit selection of any device under test to be positioned under the opening by rotation of the wafer with respect to the wafer carrier, while the wafer is substantially fully supported on the wafer carrier.

* * * * *